(12) United States Patent
Kim

(10) Patent No.: US 7,427,935 B2
(45) Date of Patent: Sep. 23, 2008

(54) APPARATUS AND METHOD OF GENERATING REFERENCE VOLTAGE OF SEMICONDUCTOR INTEGRATED CIRCUIT

(75) Inventor: Kwan-Weon Kim, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/647,482

(22) Filed: Dec. 29, 2006

(65) Prior Publication Data
US 2007/0285294 A1 Dec. 13, 2007

(30) Foreign Application Priority Data
Jun. 8, 2006 (KR) .................. 10-2006-0051252

(51) Int. Cl.
*H03M 1/10* (2006.01)
(52) U.S. Cl. ...................... 341/120; 341/155
(58) Field of Classification Search .......... 341/110–170
See application file for complete search history.

(56) References Cited

U.S. PATENT DOCUMENTS

| 5,689,460 | A | * | 11/1997 | Ooishi | 365/189.07 |
| 5,710,740 | A | | 1/1998 | Manning | |
| 5,856,951 | A | * | 1/1999 | Arimoto et al. | 365/226 |
| 5,994,935 | A | * | 11/1999 | Ueda et al. | 327/202 |
| 6,264,625 | B1 | * | 7/2001 | Rubenstein et al. | 604/9 |
| 6,281,734 | B1 | * | 8/2001 | McClure et al. | 327/308 |
| 6,437,716 | B2 | * | 8/2002 | Nakao | 341/118 |
| 6,501,299 | B2 | | 12/2002 | Kim et al. | |
| 6,661,258 | B1 | * | 12/2003 | Huang | 327/81 |
| 6,738,444 | B1 | * | 5/2004 | Suyama | 375/376 |
| 6,891,773 | B2 | * | 5/2005 | Park | 365/230.06 |
| 7,034,567 | B2 | | 4/2006 | Jang | |
| 7,142,016 | B2 | * | 11/2006 | Kim | 326/82 |

FOREIGN PATENT DOCUMENTS

| KR | 10-1997-0029744 | 6/1997 |
| KR | 10-1998-0082921 | 12/1998 |
| KR | 100206867 | 4/1999 |
| KR | 1020020080089 | 10/2002 |
| KR | 1020040083814 | 10/2004 |

* cited by examiner

*Primary Examiner*—Lam T Mai
(74) *Attorney, Agent, or Firm*—Venable LLP; Jeffri A. Kaminski

(57) ABSTRACT

An apparatus for generating a reference voltage of a semiconductor integrated circuit includes a resistance control unit that adjusts at least one an adjustment code such that at least one set of resistors, which have resistances determined according to the at least one adjustment code have predetermined resistances, a voltage level control unit that generates a selection code for selecting the level of a final reference voltage under external control and outputs the generated selection code, and a reference voltage generating unit that converts a power supply voltage according to the adjustment code and the selection code and outputs the final reference voltage.

37 Claims, 8 Drawing Sheets

FIG. 8

|  |  | Turn-ON Set | | |
|---|---|---|---|---|
|  |  | S0_PU | S0_PU<br>S1_PU | S0_PU<br>S1_PU<br>S2_PU |
| Turn-ON Set | S0_PD | 0.5VDDQ | 0.66VDDQ | 0.75VDDQ |
|  | S0_PD<br>S1_PD | 0.33VDDQ | 0.5VDDQ | 0.6VDDQ |
|  | S0_PD<br>S1_PD<br>S2_PD | 0.25VDDQ | 0.4VDDQ | 0.5VDDQ |

US 7,427,935 B2

APPARATUS AND METHOD OF GENERATING REFERENCE VOLTAGE OF SEMICONDUCTOR INTEGRATED CIRCUIT

BACKGROUND OF THE INVENTION

1. Technical Field

The present invention relates to a semiconductor integrated circuit, and in particular, to a apparatus and method of generating a reference voltage of a semiconductor integrated circuit.

2. Related Art

In general, a reference voltage is an essential voltage that has been used for various purposes in a semiconductor integrated circuit. The reference voltage may be provided from an external source or it is an internal source of the semiconductor integrated circuit.

As shown in FIG. 1, a conventional apparatus of generating a reference voltage of a semiconductor integrated circuit includes a plurality of resistors connected in series between a power terminal VDDQ and a ground terminal VSSQ. Then, an output terminal for a reference voltage Vref is formed at a node where the resistances of both terminals are consistent with each other.

In the above-described apparatus for generating a reference voltage in a semiconductor integrated circuit according to the conventional art, it may be impossible to change the level of the reference voltage, which limits its use in applicable systems.

SUMMARY OF THE INVENTION

Embodiments of the present invention provide an apparatus for generating a reference voltage of a semiconductor integrated circuit that can change the reference voltage to a desired level externally.

According to an embodiment of the present invention, an apparatus for generating a reference voltage of a semiconductor integrated circuit includes: a resistance control unit that adjust at least one adjustment code such that at least one set of resistors having a resistance determined according to the at least one adjustment code have predetermined resistances; a voltage level control unit that generates a selection code for selecting the level of a final reference voltage under external control and outputs the generated selection code; and a reference voltage generating unit that converts a power supply voltage according to the adjustment code and the selection code and outputs the final reference voltage.

According to another embodiment of the present invention, an apparatus for generating a reference voltage of a semiconductor integrated circuit having an ODT (On Die Termination) structure includes a voltage level control unit that generates a selection code for selecting the level of a reference voltage under external control; and a reference voltage generating unit that converts a power supply voltage according to at least one adjustment code supplied through the ODT structure and the selection code and outputs the reference voltage.

According to an another aspect of the present invention, there is provided a method of generating a reference voltage of a semiconductor integrated circuit having a plurality resistor sets, which have variable resistances according to adjustment codes. The method includes, detecting an adjustment code for allowing the resistances of the resistor sets to be consistent with the external resistance of the semiconductor integrated circuit; and changing a power supply voltage with the resistor sets, using the resistance according to the detected adjustment code, so as to generate the reference voltage.

According to another embodiment of the present invention, there is provided a method of generating a reference voltage of a semiconductor integrated circuit having a plurality of resistor sets, which have variable resistances according to adjustment codes. The method includes detecting an adjustment code for allowing resistances of the plurality of resistor sets to be consistent with external resistance of the semiconductor integrated circuit; inputting the detected adjustment code to resistor sets under external control among the plurality of resistor sets and stopping the operation of other resistor sets; and changing a power supply voltage with the resistor sets, to which the adjustment code is input, using a resistance according to the adjustment code so as to generate the reference voltage.

According to still another embodiment of the present invention, there is provided a method of generating a reference voltage of a semiconductor integrated circuit having an ODT (On Die Termination) unit that allows the external resistance to be consistent with the internal resistance through code setting and a plurality of resistor sets that have variable resistances according to adjustment codes. The method includes inputting a code set by the ODT unit to sets of resistors under external control among the plurality of resistor sets and stopping the operations of other resistor sets, and changing a power supply voltage with the resistor sets to which the adjustment code is input, using a resistance according to the adjustment code, so as to generate the reference voltage.

BRIEF DESCRIPTION OF THE DRAWINGS

FIG. 8 is a diagram of a selection code and reference voltage level table of the reference voltage generating unit of FIG. 2.

DESCRIPTION OF EXEMPLARY EMBODIMENTS

Hereinafter, exemplary embodiments of an apparatus and method of generating a reference voltage of a semiconductor integrated circuit according to the present invention will be described with reference to the accompanying drawings.

Figure 2:
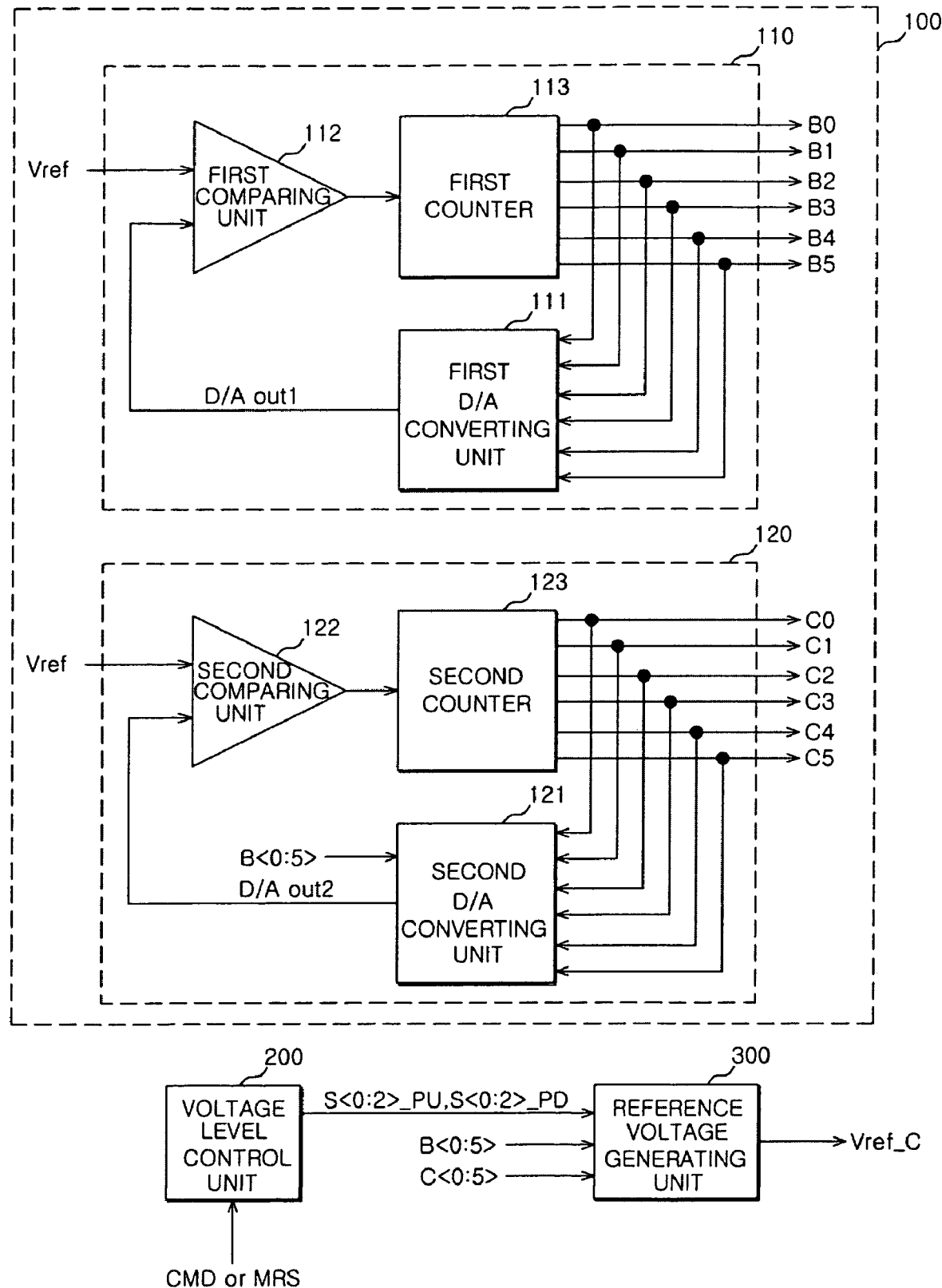
FIG. 2 is a block diagram of an apparatus for generating a reference voltage of a semiconductor integrated circuit according to an embodiment of the present invention.

Referring to FIG. 2, an apparatus for generating a reference voltage of a semiconductor integrated circuit according to an embodiment of the present invention includes a resistance control unit 100, a voltage level control unit 200, and a reference voltage generating unit 300.

Figure 1:
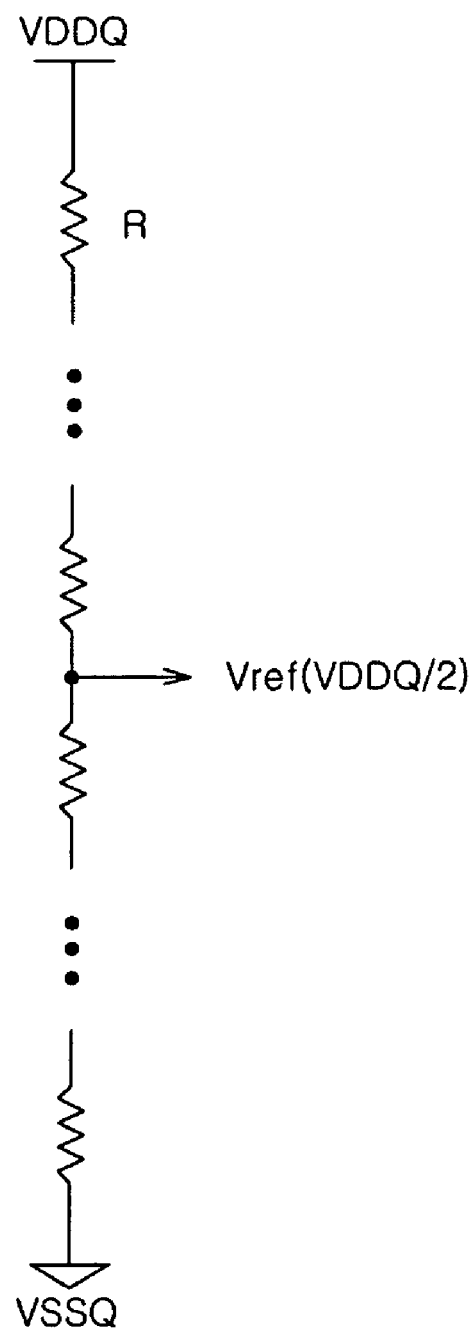
FIG. 1 is a circuit diagram of an apparatus for generating a reference voltage of a semiconductor integrated circuit according to the related art.

The resistance control unit 100 adjusts at least one adjustment code such that at least one set of resistors determined resistance by the at least one adjustment code, have a predetermined resistance. The resistance control unit 100 includes a first adjustment code generating unit 110 that generates a voltage by selectively operating a first set of resistors connected to an external resistor according to a first adjustment code B<0:5>, compares the voltage with an initial reference voltage Vref, and changes the first adjustment code B<0:5> such that the selected first set of resistors has the same resistance as the external resistor. Further, the resistance control unit 100 includes a second adjustment code generating unit 120 that generates a voltage by selectively operating a third set of resistors connected to a second set of resistors, which have the same resistance as the first set of resistors on the basis of a second adjustment code C<0:5>, compares the voltage with the reference voltage Vref, changes and outputs the second adjustment code C<0:5> such that the selected third set of resistors have the same resistance as the second set of resistors. The reference voltage Vref generated using the same structure at that shown in FIG. 1 may be used.

The first adjustment code generating unit 110 includes a first D/A converting unit 111 that converts and outputs a power supply voltage applied to the power terminal on according to a resistance ratio between the first set of resistors selected by the first adjustment code B<0:5> and the external resistor; a first comparing unit 112 that compares an output signal D/A out1 output from the first D/A converting unit 111 and the reference voltage Vref, and outputs the comparison result; and a first counter 113 that up-counts or down-counts the first adjustment code B<0:5> according to the output of the first comparing unit 112 and outputs the count result to the first D/A converting unit 111.

The second adjustment code generating unit 120 includes a second D/A converting unit 121 that converts and outputs a power supply voltage applied to the power terminal according to a resistance ratio between the second set of resistors selected by the first adjustment code B<0:5> and the third set of resistors selected by the second adjustment code C<0:5>; a second comparing unit 122 that compares an output signal D/A out2 output from the second D/A converting unit 121 and the reference voltage Vref, and outputs the comparison result; and a second counter 123 that up-counts or down-counts the second adjustment code C<0:5> and outputs the count result to the second D/A converting unit 121 according to the output signal of the second comparing unit 122.

Figure 3:
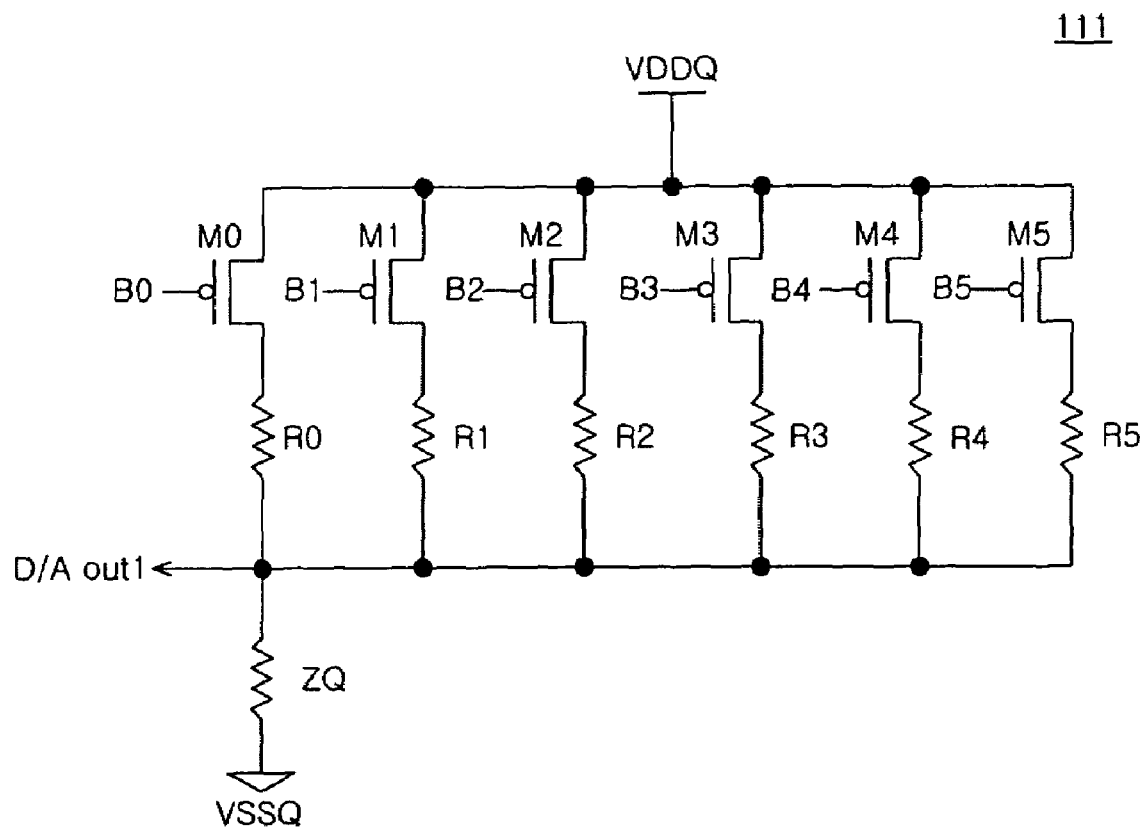
FIG. 3 is a circuit diagram showing the structure of a first D/A converting unit.

Referring to FIG. 3, the first D/A converting unit 111 includes a first set of transistors M0 to M5 having the sources commonly connected to the power terminal VDDQ and gates correspondingly received the first adjustment codes B<0:5>; a first set of resistors R0 to R5 having one of the ends correspondingly connected to the drains of the first set of transistors M0 to M5 and the other ends connected to an external resistor ZQ. An output terminal of the first D/A converting unit 111 is a connection node between the external resistor ZQ and the first set of resistors R0 to R5.

The first set of resistors R0 to R5 is just an example. In an actual circuit, the number of resistors may decrease or increase. When the number of resistors decreases or increases, the number of transistors also decreases or increases accordingly.

Figure 4:
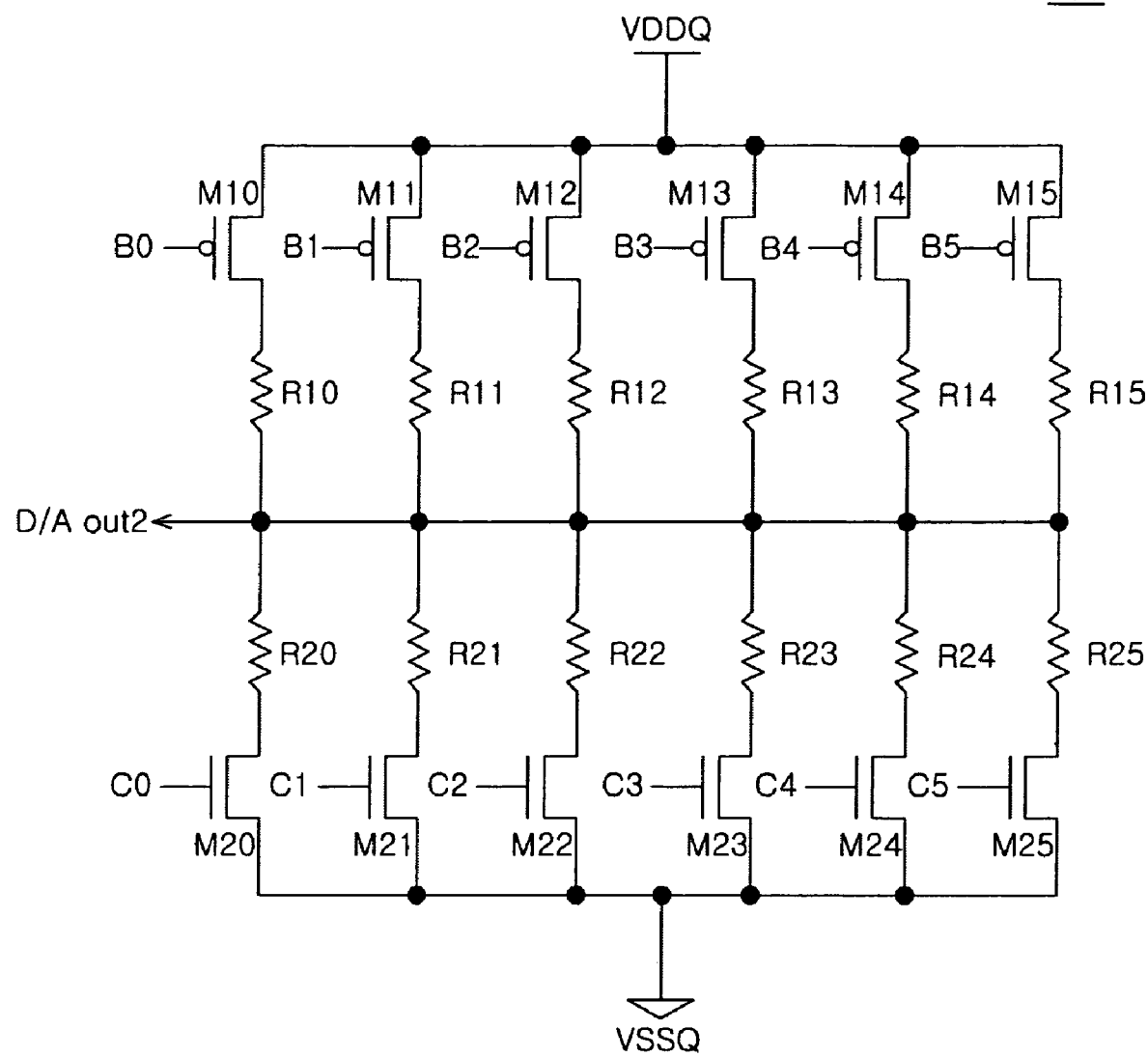
FIG. 4 is a circuit diagram of a second D/A converting unit.

Referring to FIG. 4, the second D/A converting unit 121 includes a second set of transistors M10 to M15 having the sources commonly connected to the power terminal VDDQ and the gates correspondingly input the first adjustment codes B<0:5>; a second set of resistors R10 to R15 having one of the ends correspondingly connected to drains of the second set of transistors M10 to M15; a third set of resistors R20 to R25 having one of the ends connected to the other ends of the second set of resistors R10 to R15; and a third set of transistors M20 to M25 having the drains correspondingly connected to the other ends of the third set of resistors R20 to R25, gates correspondingly input the second adjustment codes C<0:5>, and the sources commonly connected to the ground terminal VSSQ. An output terminal of the second converting unit 121 is a connection node between the second set of resistors R10 to R15 and the third set of resistors R20 to R25.

The second set of resistors R10 to R15 and the third set of resistors R20 to R25 are just examples. In an actual circuit, the number of resistors may decrease or increase. When the number of resistors decreases or increases, the number of transistors also decreases or increases accordingly. Further, the second set of resistors R10 to R15 may have the same resistances as the first set of resistors R0 to R5.

Figure 5:
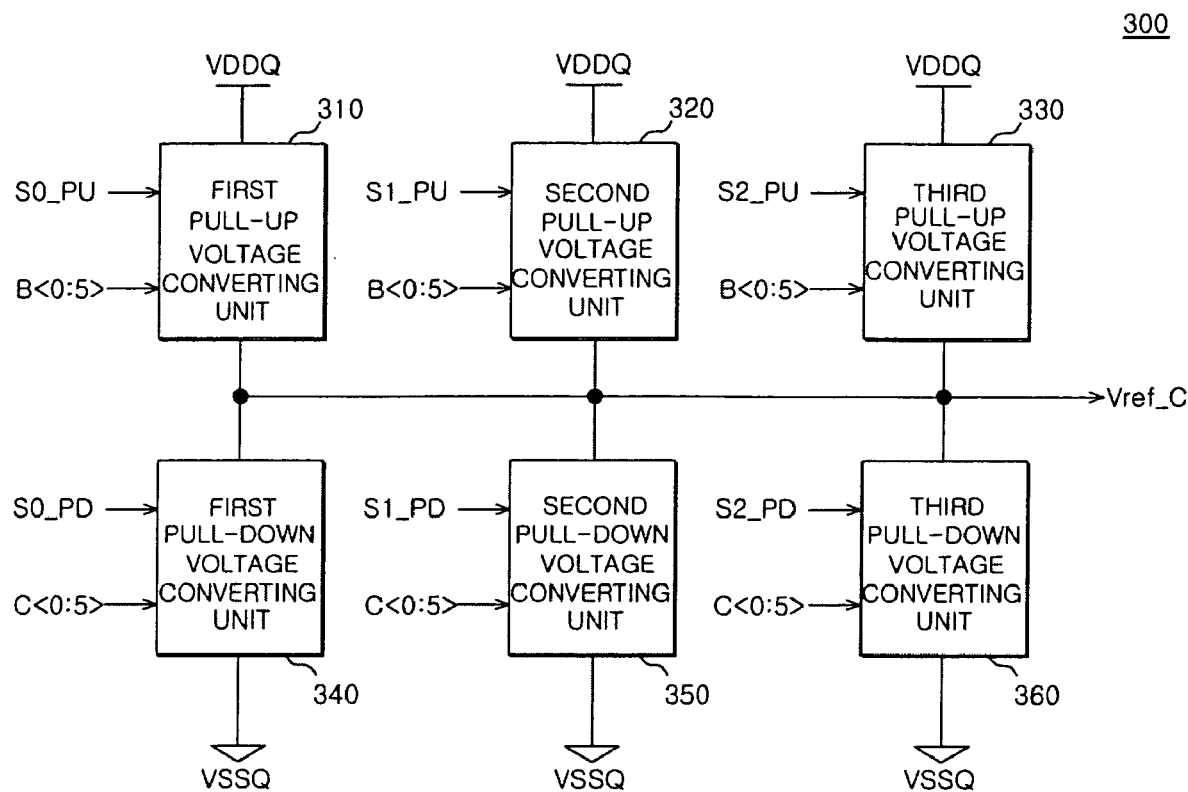
FIG. 5 is a block diagram of a reference voltage generating unit of FIG. 2.

Referring to FIG. 5, the reference voltage generating unit 300 includes first to third pull-up voltage converting units 310 to 330 that are connected to the power terminal VDDQ. The resistances of the first to third pull-up voltage are determined by the first adjustment codes B<0:5> and selection codes S<0:2>_PU. The reference voltage generating unit further includes first to third pull-down voltage converting units 340 to 360 that are respectively connected between the first to third pull-up voltage converting units 310 to 330 and the ground terminal VSSQ. The resistances of the first to third pull-down voltage converting unit 340 to 360 are determined according to the second adjustment codes C<0:5> and selection codes S<0:2>_PD. The power supply voltage VDDQ, which is converted to correspond to the total resistances of the first to third pull-up voltage converting units 310 to 330 and the first to third pull-down voltage converting units 340 to 360 is output as a final reference voltage Vref_C through the common node between the first to third pull-up voltage converting units 310 to 330 and the first to third pull-down voltage converting units 340 to 360.

Figure 6:
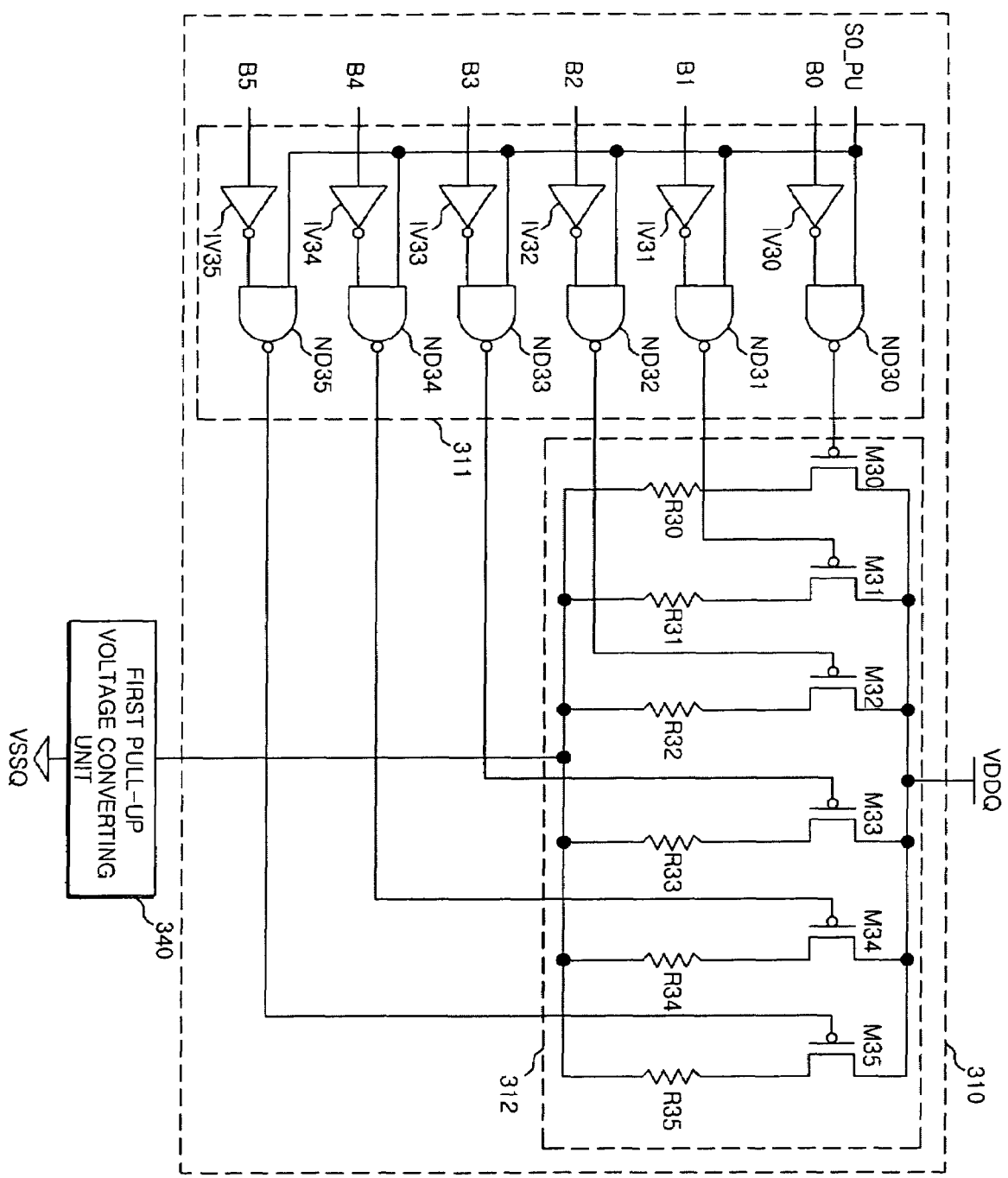
FIG. 6 is a circuit diagram of a first pull-up voltage converting unit of FIG. 5.

Referring to FIG. 6, the first pull-up voltage converting unit 310 includes a code combining unit 311 that combines a corresponding selection code S<0>_PU and the first adjustment codes B<0:5> and outputs the combination result; and a voltage converting unit 312 that converts the power supply voltage VDDQ using a resistance determined according to the output signal of the code combining unit 311. The code combining unit 311 includes a plurality of invertors IV30 to IV35 that correspondingly receive the first adjustment codes B<0:5>, and a plurality of NAND gates ND30 to ND35 having first input terminals commonly input the selection code S<0>_PU and second input terminals correspondingly input the outputs of the invertors IV30 to IV35. The voltage converting unit 312 includes a fourth set of transistors M30 to M35 having sources commonly connected to the power terminal VDDQ and gates correspondingly input the outputs of the NAND gates ND30 to ND35, and a fourth set of resistors R30 to R35 having one of the ends are correspondingly connected to the drains of the fourth set of transistors M30 to M35 and the other ends of the fourth set of resistors R30 to R35 commonly connected to the first pull-down voltage converting unit 340.

The fourth set of transistors M30 to M35 and the fourth set of resistors R30 to R35 are designed to have the same size and the same resistance as the first set of transistors M0 to M5 and the first set of resistors R0 to R5 of FIG. 3, respectively.

The second and third pull-up voltage converting units 320 and 330 have the same structure as the first pull-up voltage converting unit 310, except for the input selection codes S1_PU and S2_PU, and thus the descriptions thereof will be omitted.

Figure 7:
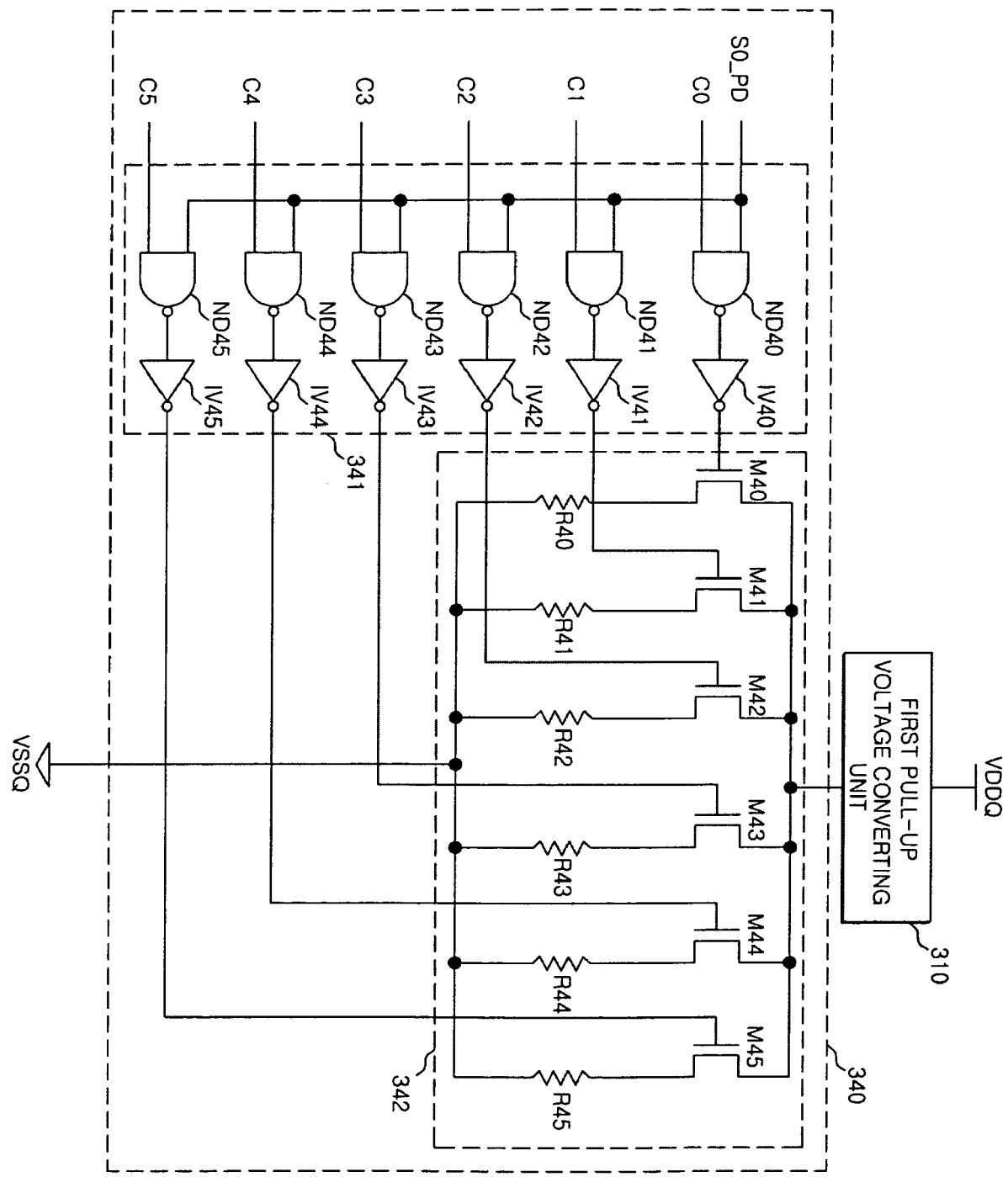
FIG. 7 is a circuit diagram of a first pull-down voltage converting unit of FIG. 5.

Referring to FIG. 7, the first pull-down voltage converting unit 340 includes a code combining unit 341 that combines a corresponding selection code S<0>_PD and the second adjustment codes C<0:5> and outputs the combination results; and a voltage converting unit 342 that converts the power supply voltage VDDQ using a resistance determined according to the output signal of the code combining unit 341. The code combining unit 341 includes a plurality of NAND gates ND40 to ND45 having first input terminals commonly input the selection code S<0>_PD and second input terminals correspondingly input the second adjustment codes C<0:5>; and a plurality of invertors IV30 to IV35 that correspondingly receive the outputs of the plurality of NAND gates ND40 to ND45. The voltage converting unit 342 includes a fifth set of transistors M40 to M45 having the sources commonly connected to the first pull-up voltage converting unit 310 and gates correspondingly input the outputs of the inverters IV40 to IV45, and a fifth set of resistors R40 to R45 having one of the ends correspondingly connected to the drains of the fifth set of transistors M40 to M45 and the other ends commonly connected to the ground terminal VSSQ.

The second and third pull-down voltage converting units 350 and 360 have the same structure as the first pull-down voltage converting unit 340, except for the input selection codes S1_PD and S2_PD, and thus the descriptions thereof will be omitted.

The fifth set of transistors M40 to M45 and the fifth set of resistors R40 to R45 are designed to have the same size and the same resistance as the third set of transistors M20 to M25 and the third set of resistors R20 to R25 of FIG. 4, respectively.

The operation of the apparatus for generating a reference voltage of a semiconductor integrated circuit having the above structure according to the embodiment of the present invention will be described below.

When power is supplied to the semiconductor integrated circuit, the resistance control unit 100 of FIG. 2 is driven according to a predetermined operation sequence in order to adjust the codes (the first adjustment codes B<0:5> and the second adjustment codes C<0:5>) for allowing the resistance of each of the voltage converting units 310 to 360 of FIG. 5 to be consistent with the external resistor ZQ.

First, the first adjustment code generating unit 110 is driven to adjust the first adjustment code B<5> such that the resistance of the first set of resistors R0 to R5 in the first D/A converting unit 111 of FIG. 3 are consistent with the external resistor ZQ. That is, the first D/A converting unit 111 converts the power supply voltage VDDQ according to a resistance ratio between a resistor among the first set of resistors R0 to R5 selected according to a default code B<0:5>, and the external resistor ZQ, and outputs the output D/A out1. Then, the first comparing unit 112 compares the output D/A out1 and the reference voltage Vref and outputs the comparing result (i.e., high or low signal). The first counter 113 up-counts or down-counts the first adjustment code B<0:5> according to the output of the first comparing unit 112 and outputs the count result to the first D/A converting unit 111. The above-described steps are repeated a required number of times until the first adjustment code B<0:5> is adjusted so that the resistance of the first set of resistors R0 to R5 in the first D/A converting unit 111 of FIG. 3 is consistent with the external resistor ZQ.

Next, the second adjustment code generating unit 120 determines the second adjustment code C<0:5> such that the resistances of the third set of resistors R20 to R25 in the second D/A converting unit 121 of FIG. 4 is consistent with the resistance of the second set of resistors R10 to R15 determined according to the input of the first adjustment code B<0:5>. The resistance of the first set of resistors R0 to R5 of FIG. 3 is consistent with the external resistor ZQ on the basis of the first adjustment code B<0:5>. Further, the resistance of the second set of resistors R10 to R15 of FIG. 4 is consistent with the resistances of the first set of resistors R0 to R5. Therefore, if the first adjustment code B<0:5> is input to the second set of resistors R10 to R15, the resistance thereof are consistent with the external resistor ZQ. That is why the second adjustment code C<0:5> is adjusted such that the resistance of the third set of resistors R20 to R25 is consistent with the resistance of the second set of resistors R10 to R15. The second D/A converting unit 121 converts the power supply voltage VDDQ and then outputs the output D/A out2 according to a resistance ratio between a resistor among the second set of resistors R10 to R15, according to the first adjustment code B<0:5>, and the resistor selected among the third set of resistors R20 to R25 according to the default second adjustment code C<0:5>. Thereafter, the second comparing unit 122 compares the output D/A out2 and the reference voltage Vref and outputs the comparing result. Further, the second counter 123 up-counts or down-counts the second adjustment code C<0:5> according to the output of the second comparing unit 122, and outputs the count result to the second D/A converting unit 121. If the above-described steps are repeated a required number of times, the second adjustment code C<0:5> is determined such that the resistance of the third set of resistors R20 to R25 in the second D/A converting unit 121 of FIG. 4 is consistent with the resistance of the second set of resistors R10 to R15.

When the above-described code (the first adjustment code B<0:5> and the second adjustment code C<0:5>) adjustment is completed, the reference voltage generating unit 300 of FIG. 5 that receives the first adjustment code B<0:5> and the second adjustment code C<0:5> is driven according to the selection codes S<0:2>_PU and S<0:2>_PD, such that a final reference voltage Vref_C to be actually supplied to the individual parts of the semiconductor integrated circuit is generated.

The first to third pull-up voltage converting units 310 to 330 and the first to third pull-down voltage converting units 340 to 360 of FIG. 5 operate only when a selection code to be input thereto among the selection codes S<0:2>_PU and S<0:2>_PD is enabled. In this state, if the first to third pull-up voltage converting units 310 to 330 and the first to third pull-down voltage converting units 340 to 360 is input the first adjustment code B<0:5> and the second adjustment code C<0:5>), the total resistance of the first to third pull-up voltage converting units 310 to 330 and the first to third pull-down voltage converting units 340 to 360 is set to identify the external resistance ZQ and the final reference voltage Vref_C is generated. For example, if both the selection codes S<0:2>_PU and S<0:2>_PD are enabled and the external resistor ZQ has a resistance of 240, the total resistances of the first to third pull-up voltage converting units 310 to 330 and the first to third pull-down voltage converting units 340 to 360 are also set to 240.

For example, if the selection code S0_PU is enabled at a high level, the NAND gates ND30 to ND35 of the code combining unit 311 in the first pull-up voltage converting unit 310 of FIG. 6 invert and output the output signals of the invertors IV30 to IV35. Therefore, the first adjustment code B<0:5> is input to the voltage converting unit 312 with an original phase (or level). Thus, the fourth set of transistors M30 to M35 are selectively turned on and the fourth set of resistors R30 to R35 correspondingly connected to the fourth set of transistors M30 to M35 are selectively connected to the power terminal VDDQ, thereby setting the resistances.

When the selection code S0_PU is disabled at a low level, the NAND gates ND30 to ND35 of the code combining unit 311 in the first pull-up voltage converting unit 310 of FIG. 6 output a high level signal regardless of the first adjustment codes B<0:5>, that is, the outputs of the invertors IV30 to IV35. Therefore, since the fourth set of transistors M30 to M35 of the voltage converting unit 312 are turned off, the resistances of the fourth set of resistors R30 to R35 cannot be set.

In addition, if the selection code S0_PD is enabled at a high level, the second adjustment code C<0:5> is input to the voltage converting unit 342 through an AND operation by the NAND gates ND40 to ND45 and the inverters IV40 to IV45 of the code combining unit 341 in the first pull-down voltage converting unit 340 of FIG. 7. Therefore, the fifth set of transistors M40 to M45 are selectively turned on and the fifth set of resistors R40 to R45 correspondingly connected to the fifth set of transistors M40 to M45 are selectively connected to the ground terminal VSSQ, thereby setting the resistances.

Meanwhile, when the selection code S0_PD is disabled at a low level, the NAND gates ND40 to ND45 of the code combining unit 341 in the first pull-up voltage converting unit 340 of FIG. 7 output a low level signal regardless of the second adjustment code C<0:5>, that is, the outputs of the invertors IV40 to IV45. Therefore, since the fifth set of transistors M40 to M45 of the voltage converting unit 342 are turned off, the resistances of the fourth set of resistors R40 to R45 cannot be set.

According to the embodiment of the present invention, as shown in FIG. 8, the reference voltage level can be easily changed from externally with the above-described selection code combination method under the external control from the outside, that is, a predetermined command (CMD) (for example, a test mode command or mode register set information (hereinafter, referred to as MRS)).

That is, if the CMD or MRS is input externally, the CMD or MRS is input to the voltage level control unit 200 of FIG. 2. The voltage level control unit 200 is configured to output the predetermined selection code S<0:2>_PU or S<0:2>_PD according to the CMD or MRS. Therefore, the level of the reference voltage can be selected by the combination of the selection codes output from the voltage level control unit 200 according to the CMD or MRS.

For example, if the voltage level control unit 200 outputs the selection codes S0_PU and S0_PD at a high level and other selection codes at a low level, only the first pull-up voltage converting unit 310 and the first pull-down voltage converting unit 340 of FIG. 5 operate. Since the resistance of the first pull-up voltage converting unit 310 is consistent with the resistance of the second pull-down voltage converting unit 340 (for example, 240), the level of the reference voltage Vref_C corresponds to 240/(240+240) VDDQ=0.5 VDDQ. As shown in FIG. 8, the level of the reference voltage Vref_C may be 0.5 VDDQ by the combination of other selection codes.

Further, if the voltage level control unit 200 outputs the selection codes S0_PU and S<0:2>_PD at a high level and other selection codes at a low level, only the first pull-up voltage converting unit 310 and the first to third pull-down voltage converting units 340 to 360 of in FIG. 5 operate. Since the resistance of the first pull-up voltage converting unit 310 is consistent with the resistance of each of the first to third pull-down voltage converting units 340 to 360, the level of the reference voltage Vref_C corresponds to 80/(240+80) VDDQ=0.25 VDDQ.

In addition, if the voltage level control unit 200 outputs the selection codes S<0:2>_PU and S0_PD at a high level and other selection codes at a low level, only the first to third pull-up voltage converting units 310 to 330 and the first pull-down voltage converting unit 340 of FIG. 5 operate. Therefore, the level of the reference voltage Vref_C corresponds to 240/(240+80) VDDQ=0.75 VDDQ.

Hereinafter, still another embodiment of the invention will be described below.

In case of a semiconductor integrated circuit having an ODT (On Die Termination) structure, a code is used to adjust a resistance of a driver. This code may be used, instead of the code generated by the resistance control unit 100 shown in FIG. 2.

Therefore, in case of the semiconductor integrated circuit having the ODT structure, according to the embodiment of the present invention, a structure, in which the resistance control unit 100 may be removed from the structure of FIG. 2, may be configured.

If the number of bits of the code supplied from the ODT is consistent with the number of bits used in the embodiment of the invention shown in FIG. 2, according to the embodiment of the present invention, a structure, in which the resistance control unit 100 is removed from the structure of FIG. 2, may be configured without additionally changing the circuit.

However, if the number of bits of the code supplied from the ODT is inconsistent with the number of bits used in the embodiment of the present invention, the circuit structure of the reference voltage generating unit 300 (the code combining unit and the voltage converting unit) may be designed to correspond to the number of bits of codes supplied from the ODT.

It will be apparent to those skilled in the art that various modifications and changes may be made without departing from the scope and spirit of the present invention. Therefore, it should be understood that the above embodiments are not limitative, but illustrative in all embodiments. The scope of the present invention is defined by the appended claims rather than by the description preceding them, and therefore all changes and modifications that fall within metes and bounds of the claims, or equivalents of such metes and bounds are therefore intended to be embraced by the claims.

In the apparatus and method of generating a reference voltage of a semiconductor integrated circuit according to the embodiments of the invention, the level of the reference voltage may be easily changed by a simple control command from the outside. Therefore, the apparatus and method of generating a reference voltage of a semiconductor integrated circuit according to the embodiments of the invention can be applied to various systems, without changing circuit design, even though operational characteristics of a system to which the semiconductor integrated circuit is applied are changed.

What is claimed is:

1. An apparatus for generating a reference voltage of a semiconductor integrated circuit, the apparatus comprising:
    a resistance control unit that adjusts at least one adjustment code such that at least one set of resistors, which have resistance determined according to the at least one adjustment code have predetermined resistances;
    a voltage level control unit that generates a selection code for selecting a level of a reference voltage under an external control; and
    a reference voltage generating unit that converts a power supply voltage according to the adjustment code and the selection code and outputs the reference voltage.

2. The apparatus of claim 1,
    wherein the resistance control unit includes: a first adjustment code generating unit that varies the resistance of a first set of resistors connected to an external resistor according to a first adjustment code, changes the power supply voltage according to the varied resistances adjusts the first adjustment code such that the power supply voltage is consistent with an initial reference voltage, and outputs the adjusted first adjustment code; and a second adjustment code generating unit that varies resistances of a third set of resistors correspondingly connected to a second set of resistors having the same resistance as the first set of resistors according to the first adjustment code, changes the power supply voltage according to the varied resistance, adjusts the second adjustment code such that the power supply voltage is consistent with the initial reference voltage, and outputs the adjusted first adjustment code.

3. The apparatus of claim 2,
wherein the first adjustment code generating unit includes:
a D/A converting unit that converts and outputs the power supply voltage applied to a power terminal according to a resistance ratio between the first set of resistors selected by the first adjustment code and the external resistor;
a comparing unit that compares the output of the D/A converting unit and the initial reference voltage and outputs the comparison result; and
a counter that up-counts or down-counts the first adjustment code according to the output of the comparing unit and outputs the count result to the D/A converting unit.

4. The apparatus of claim 3,
wherein the D/A converting unit includes:
the first set of resistors; and
a set of transistors having drains correspondingly connected to one ends of the first set of resistors, sources commonly connected to the power terminal, and gates input the first adjustment code is input.

5. The apparatus of claim 4,
wherein the other ends of the first set of resistors are commonly connected to the external resistor.

6. The apparatus of claim 4,
wherein an output terminal is a connection node between the external resistor and the first set of resistors.

7. The apparatus of claim 2,
wherein the second adjustment code generating unit includes:
a D/A converting unit that converts and outputs the power supply voltage applied to a power terminal according to a resistance ratio between the second set of resistors having resistances determined according to the first adjustment code and a third set of resistors having resistances determined according to the second adjustment code;
a comparing unit that compares the output of the D/A converting unit and the initial reference voltage and outputs the comparison result; and
a counter that up-counts or down-counts the second adjustment code according to the output of the comparing unit and outputs the count result to the D/A converting unit.

8. The apparatus of claim 7,
wherein the D/A converting unit includes:
the second set of resistors;
a first set of transistors having drains correspondingly connected to one of the ends of the second set of resistors, sources commonly connected to the power terminal, and gates input the first adjustment code; and
a third set of resistors having one of the ends correspondingly connected to the other ends of the second set of resistors; and
a third set of transistors having drains correspondingly connected to the other ends of the third set of resistors, gates input the second adjustment code, and sources commonly connected to the ground terminal.

9. The apparatus of claim 8,
wherein an output terminal is formed at a connection node between the second set of resistors and the third set of resistors.

10. The apparatus claim 2,
wherein the resistances of the first to third sets of resistors are consistent with one another.

11. The apparatus of claim 1, further comprising:
a plurality of resistors that convert the power supply voltage through one of a plurality of nodes and outputs the initial reference voltage.

12. The apparatus of claim 1,
wherein the external control includes at least one of a test mode command and mode register set information.

13. The apparatus of claim 1,
wherein the reference voltage generating unit includes:
a plurality of pull-up voltage converting units that are connected to the power terminal and resistances of which are determined according to the first adjustment code and the selection code; and
a plurality of pull-down voltage converting units that are respectively connected between the plurality of pull-up voltage converting units and the ground terminal and the resistances of which are determined according to the second adjustment code and the selection code,
wherein the reference voltage is output from a common node between the pull-up voltage converting units and the pull-down voltage converting units.

14. The apparatus of claim 13,
wherein the pull-up voltage converting unit includes:
a code combining unit that combines the first adjustment code and the selection code and outputs the combination result; and
a voltage converting unit that converts the power supply voltage using a resistance determined according to the output of the code combining unit.

15. The apparatus of claim 14,
wherein the code combining unit includes:
a plurality of inverters that receive the first adjustment code; and
a plurality of NAND gates having first input terminals, to which the selection code is commonly input, and second input terminals, to which the outputs of the invertors are correspondingly input.

16. The apparatus of claim 14,
wherein the voltage converting unit includes:
a set of transistors having sources commonly connected to the power terminal and gates input the output of the code combining unit is input; and
a set of resistors having one of the ends correspondingly connected to the drains of the set of transistors, and the other ends commonly connected to the pull-down voltage converting unit.

17. The apparatus of claim 13,
wherein the pull-down voltage converting unit includes:
a code combining unit that combines the second adjustment code and the selection code and outputs the combination result; and
a voltage converting unit that converts the power supply voltage using a resistance determined according to the output of the code combining unit.

18. The apparatus of claim 17,
wherein the code combining unit includes:
a plurality of NAND gates having first input terminals to which the selection code is commonly input, and second input terminals to which the second adjustment code is input; and
a plurality of inverters that correspondingly receive the outputs of the plurality of NAND gates.

19. The apparatus of claim 17,
wherein the voltage converting unit includes:
a set of transistors having sources connected to the pull-up voltage converting unit, and gates input the output of the code combining unit is input; and
a set of resistors having one of their ends correspondingly connected to drains of the set of transistors and the other ends commonly connected to the ground terminal.

20. An apparatus for generating a reference voltage of a semiconductor integrated circuit having an ODT (On Die Termination) structure configured to generate an adjustment code, the apparatus comprising:
a voltage level control unit that generates a selection code for selecting the level of a reference voltage under an external control; and
a reference voltage generating unit that converts a power supply voltage according to the adjustment code and the selection code and outputs the reference voltage.

21. The apparatus of claim 20,
wherein the external control includes at least one of a test mode command and mode register set information.

22. The apparatus of claim 20,
wherein the reference voltage generating unit includes:
a plurality of pull-up voltage converting units that are connected to the power terminal and the resistances of which are determined according to a first adjustment code and the selection code; and
a plurality of pull-down voltage converting units that are respectively connected between the plurality of pull-up voltage converting units and the ground terminal and the resistances of which are determined according to a second adjustment code and the selection code,
wherein the reference voltage is output from a common node between the pull-up voltage converting units and the pull-down voltage converting units.

23. The apparatus of claim 22,
wherein the pull-up voltage converting unit includes:
a code combining unit that combines the first adjustment code and the selection code and outputs the combination result; and
a voltage converting unit that converts the power supply voltage using a resistance determined according to the output of the code combining unit.

24. The apparatus of claim 23,
wherein the code combining unit includes:
a plurality of inverters that receive the first adjustment code; and
a plurality of NAND gates having first input terminals to which the selection code is commonly input, and second input terminals, to which the outputs of the invertors are correspondingly input.

25. The apparatus of claim 23,
wherein the voltage converting unit includes:
a set of transistors having sources commonly connected to the power terminal, and gates input the output of the code combining unit is input; and
a set of resistors having one of their ends correspondingly connected to the drains of the set of transistors, and the other ends commonly connected to the pull-down voltage converting unit.

26. The apparatus of claim 22,
wherein the pull-down voltage converting unit includes:
a code combining unit that combines the second adjustment code and the selection code and outputs the combination result; and
a voltage converting unit that converts the power supply voltage using a resistance determined according to the output of the code combining unit.

27. The apparatus of claim 26,
wherein the code combining unit includes:
a plurality of NAND gates having first input terminals to which the selection code is commonly input, and second input terminals input the second adjustment code is input; and
a plurality of invertors that correspondingly receive the outputs of the NAND gates.

28. The apparatus of claim 26,
wherein the voltage converting unit includes:
a set of transistors having sources connected to the pull-up voltage converting unit, and gates input the output of the code combining unit is input; and
a set of resistors having one on their ends correspondingly connected to the drains of the set of transistors and the other ends commonly connected to the ground terminal.

29. A method of generating a reference voltage of a semiconductor integrated circuit having a plurality of resistor sets which have variable resistances according to an adjustment code, the method comprising:
detecting an adjustment code for allowing the resistances of the plurality of resistor to be consistent with the resistance of an external resistor of the semiconductor integrated circuit; and
changing a power supply voltage with the plurality of resistor sets using the resistance according to the detected adjustment code, so as to generate the reference voltage,
wherein the detecting of the adjustment code includes:
inputting the adjustment code to an additional set of resistors having the same original resistance as the plurality of resistor sets while changing the adjustment code step by step, and changing the power supply voltage using the resistances varied in steps; and
detecting the adjustment code for allowing the changed power supply voltage to be consistent with a predetermined voltage.

30. A method of generating a reference voltage of a semiconductor integrated circuit having a plurality of sets of resistors which have variable resistances according to an adjustment code, the method comprising:
detecting an adjustment code for allowing the resistance of the plurality of sets of resistors to be consistent with the resistance of an external resistor of the semiconductor integrated circuit;
inputting the detected adjustment code to a set of resistors under an external control among the plurality of resisters sets and stopping the operation of the other sets of resistors; and
changing a power supply voltage with the set of resistors, to which the adjustment code is input, using the resistance according to the adjustment code, so as to generate the reference voltage.

31. The method of claim 30,
wherein the detecting of the adjustment code includes:
inputting the adjustment code to an additional set of resistors which have the same original resistance as the plurality of resistor sets while changing the adjustment code step by step and changing the power supply voltage using the resistance varied in steps; and
detecting the adjustment code for allowing the changed voltage to be consistent with a predetermined voltage.

32. The method of claim 30,
wherein the external control includes at least one of a test mode command and mode register set information.

33. The method of claim 30,
wherein stopping the operation of the sets of resistors includes cutting-off a flow of the power supply current to the sets of resistors.

34. The method of claim 30,
wherein the level of the reference voltage is determined according to the number of sets of resistors to which the adjustment code is input.

35. A method of generating a reference voltage of a semiconductor integrated circuit having an ODT (On Die Termination) unit that allows external resistance to be consistent with internal resistance through code setting and a plurality of resistor sets which have variable resistances according to an adjustment code, the method comprising:
inputting a code set by the ODT unit to a set of resistors under external control among the plurality of resistor sets and stopping the operation of the other sets of resistors; and
changing a power supply voltage with the set of resistors to which the adjustment code is input, using the resistance according to the adjustment code, so as to generate the reference voltage, wherein the level of the reference voltage level is determined according to the number of sets of resistors to which the adjustment code is input.

36. The method of claim 35,
wherein the external control includes at least one of a test mode command and mode register set information.

37. The method of claim 35,
wherein the stopping the operation of the sets of resistors includes cutting-off the flow of a power supply current to the sets of resistors.

* * * * *